United States Patent
Wang et al.

(10) Patent No.: US 7,795,070 B2
(45) Date of Patent: Sep. 14, 2010

(54) SEMICONDUCTOR DEVICE INCLUDING AN AMORPHOUS NITRIDED SILICON ADHESION LAYER AND METHOD OF MANUFACTURE THEREFOR

(75) Inventors: Maria Wang, Plano, TX (US); Erika Leigh Shoemaker, Richardson, TX (US); Mary Roby, Plano, TX (US); Stuart Jacobsen, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/693,833

(22) Filed: Mar. 30, 2007

(65) Prior Publication Data

US 2008/0237865 A1  Oct. 2, 2008

(51) Int. Cl.
*H01L 27/07* (2006.01)
*H01L 21/04* (2006.01)

(52) U.S. Cl. .............. 438/105; 438/237; 438/238; 257/528; 257/E27.033; 257/E21.041; 257/E21.051; 257/E21.053

(58) Field of Classification Search .............. 438/105, 438/237, 238; 257/528, E27.033, E21.041, 257/E21.051, E21.053
See application file for complete search history.

(56) References Cited

U.S. PATENT DOCUMENTS

| 7,352,015 B2 * | 4/2008 | Piner et al. .................. 257/190 |
| 2002/0016085 A1 | 2/2002 | Huang et al. |
| 2003/0127709 A1 | 7/2003 | Lippmann et al. |
| 2005/0078151 A1 | 4/2005 | Bell et al. |
| 2006/0175609 A1 * | 8/2006 | Chan et al. .................... 257/59 |

* cited by examiner

*Primary Examiner*—Victor A Mandala
(74) *Attorney, Agent, or Firm*—Jacqueline J. Garner; Wade J. Brady, III; Frederick J. Telecky, Jr.

(57) ABSTRACT

Provided is a method for manufacturing a semiconductor device. The method for manufacturing the semiconductor device, without limitation, includes forming a first semiconductor layer over a substrate, and forming a second semiconductor layer over the first semiconductor layer, wherein an amorphous nitrided silicon adhesion layer is located between and adheres the first and second semiconductor layers.

6 Claims, 4 Drawing Sheets

SEMICONDUCTOR DEVICE INCLUDING AN AMORPHOUS NITRIDED SILICON ADHESION LAYER AND METHOD OF MANUFACTURE THEREFOR

TECHNICAL FIELD OF THE INVENTION

The disclosure is directed, in general, to a semiconductor device and, more specifically, to a semiconductor device including an amorphous nitrided silicon adhesion layer and method of manufacture therefor.

BACKGROUND OF THE INVENTION

Adhesion layers are commonly used in the manufacture of semiconductor and other related devices. For instance, adhesion layers are often used in such devices to adhere two conductive features to one another, as well as adhere non-conductive (e.g., dielectric) and conductive features to one another. In general, these adhesion layers need to be compatible with the materials they are adhering, in addition to being compatible with the manufacturing process flow of the device.

Accordingly, what is needed is a new adhesion layer and method for manufacturing the same that accommodates the aforementioned compatibility issues.

SUMMARY OF THE INVENTION

To address the above-discussed deficiencies of the prior art, provided is a method for manufacturing a semiconductor device. The method for manufacturing the semiconductor device, without limitation, includes forming a first semiconductor layer over a substrate, and forming a second semiconductor layer over the first semiconductor layer, wherein an amorphous nitrided silicon adhesion layer is located between and adheres the first and second semiconductor layers.

An alternative method for manufacturing a semiconductor device is also provided. This alternative method, in one embodiment, includes forming transistor devices over a substrate, wherein each of the transistor devices includes a gate structure and source/drain regions, and forming a semiconductor feature over the substrate. The process of forming the semiconductor feature may include forming a first semiconductor layer over the substrate, and forming a second semiconductor layer over the first semiconductor layer, wherein an amorphous nitrided silicon adhesion layer is located between and adheres the first and second semiconductor layers. The alternative method may further include forming interconnects within dielectric layers located over the transistor devices and semiconductor feature, wherein one or more of the interconnects electrically contact one or more of the transistor devices.

Additionally provided is a semiconductor device. The semiconductor device, in this embodiment, includes a first semiconductor layer located over a substrate, and a second semiconductor layer located over the first semiconductor layer. The semiconductor device further includes an amorphous nitrided silicon adhesion layer located between and adhering the first and second semiconductor layers.

BRIEF DESCRIPTION OF THE DRAWINGS

For a more complete understanding of the disclosure, reference is now made to the following descriptions taken in conjunction with the accompanying drawings, in which.

DETAILED DESCRIPTION

Figure 1:
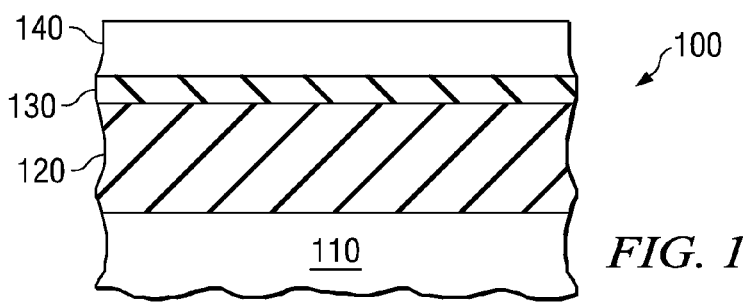
FIG. 1 illustrates one embodiment of a method for manufacturing a semiconductor device.

FIG. 1 illustrates a view showing one embodiment of a method for manufacturing a semiconductor device 100. The semiconductor device 100, in the embodiment shown, is being depicted as a semiconductor feature. For instance, the device 100 could form at least a portion of a resistor, a fuse, a capacitor or a Schottky diode. Nevertheless, the device 100 could form at least a portion of any device needing two semiconductor layers adhered to one another.

FIG. 1 illustrates the device 100 at an initial stage of manufacture. The device 100 initially includes a substrate 110. The substrate 110 may be any layer or feature located within a semiconductor device. Accordingly, the substrate 110 may comprise a conductive layer or a dielectric layer. In the given embodiment of FIG. 1, however, the substrate 110 comprises a metal or metal alloy as might be used in a capacitor.

Formed over the substrate 110 is a first semiconductor layer 120. The term "semiconductor layer", as used throughout this disclosure, means any currently known or hereafter discovered layer used in the manufacture of semiconductor devices. Accordingly, the semiconductor layers of this disclosure may not only comprise layers having semiconducting properties, but may additionally include layers having dielectric or conductive properties.

The first layer 120, at least in the embodiment of FIG. 1, comprises a dielectric material. For instance, in one embodiment the first layer 120 comprises diamond like carbon, whether doped (e.g., silicon doped, nitrogen doped, titanium doped, etc.) or undoped. Nevertheless, the first layer 120 might also comprise various other dielectric materials, including silicon, polysilicon, silicon dioxide (e.g., BPSG, TEOS, SILOX, etc.), silicon carbide, silicon nitride, silicon oxynitride, diamond, etc. Moreover, it should be reiterated that the first layer 120 need not comprise a dielectric material, and thus could also comprise various different conductive materials (e.g., metal or metal alloys).

Those skilled in the art understand the process for forming the first layer 120. For instance, depending on the material that the first layer 120 comprises, various conventional or non-conventional processes might be used to form the first layer 120. In the above discussed embodiment wherein the first layer 120 comprises diamond like carbon, the first layer 120 might be formed in a reactive ion etch chamber using tetra methyl silane and methane gas. More details regarding the formation of the diamond like carbon layer will be give in certain alternative embodiments discussed below. In the embodiments wherein the first layer 120 comprises a different material, other suitable processes would generally be used.

Formed over the first semiconductor layer 120 in the embodiment of FIG. 1 is an amorphous nitrided silicon adhesion layer 130. The amorphous nitrided silicon adhesion layer 130 has a different spectral definition than a traditional silicon nitride layer. For example, the amorphous nitrided silicon adhesion layer 130 can be differentiated from a traditional silicon nitride layer by means of Raman spectroscopy. Raman is a structural characterization tool which is sensitive to the arrangement of bonds in a material rather than its chemical composition. The frequency of the Raman line is a rather direct measure of the vibrational frequencies of the sample, which in turn is a rather direct indication of the types of electron bonding in the sample.

Figure 2A:
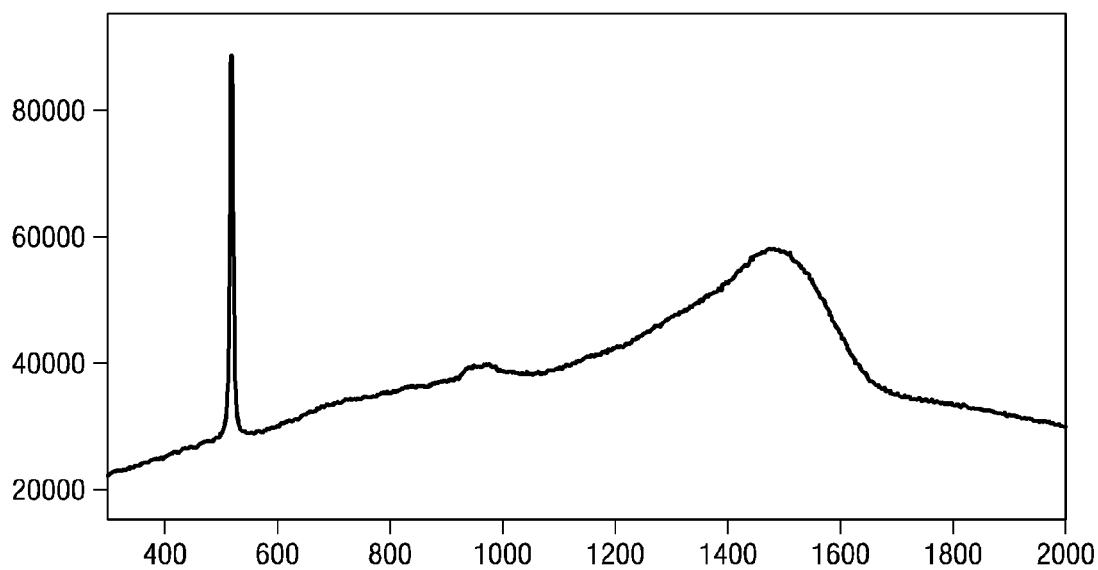
FIGS. 2A and 2B illustrate a spectral definition for one embodiment of an amorphous nitrided silicon adhesion layer and a spectral definition for one example of a traditional silicon nitride layer, respectively.
Figure 2B:
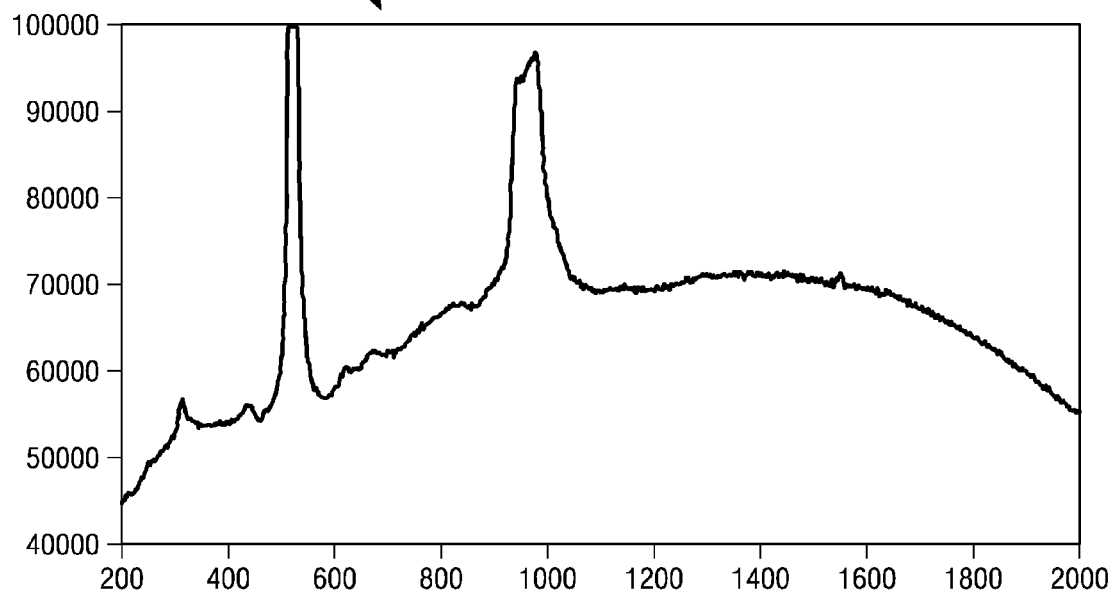

Turning briefly to FIGS. 2A and 2B, illustrated are a spectral definition 200 for one embodiment of an amorphous nitrided silicon adhesion layer and a spectral definition 250 for one example of a traditional silicon nitride layer, respectively. The amorphous nitrided silicon adhesion layer represented by FIG. 2A has a Raman frequency of about 1486 $cm^{-1}$. While this value is representative of only one embodiment of an amorphous nitrided silicon adhesion layer, and thus is dependent upon a number of different criteria, it is believed that the amorphous nitrided silicon adhesion layer should have a Raman frequency ranging from about 1461 $cm^{-1}$ to about 1511 $cm^{-1}$. In turn, the traditional silicon nitride layer represented by FIG. 2B has a Raman frequency of about 840 $cm^{-1}$, which is well outside of the Raman frequency range of any amorphous nitrided silicon adhesion layer.

The adhesion layer 130 of FIG. 1 may have a number of different thicknesses and remain within the purview of this disclosure. For example, in one embodiment the adhesion layer 130 has a thickness ranging from about 20 nm to about 200 nm. In an alternative embodiment, the adhesion layer 130 has a thickness ranging from about 40 nm to about 60 nm. Other thicknesses outside of these ranges could also be used.

The adhesion layer 130 of FIG. 1 may be formed using various different processing conditions. For instance, in one embodiment a reactive ion etch chamber is used to form the adhesion layer 130. In such an embodiment, the adhesion layer 130 would be deposited in a radio frequency (RF) parallel plate reactor with the cathode negatively biased to the RF. Additionally, a standard 13.56 MHz RF source could be used. In this embodiment, the RF would be applied to the cathode (e.g., at room temperature) and the DC bias monitored as the adhesion layer 130 is deposited for a given time or to a given thickness.

The mixture used to form the adhesion layer 130 may, among others, include tetra methyl silane and nitrogen gas. In this embodiment, the tetra methyl silane is in gas phase and may be provided to the RF parallel plate reactor in an amount ranging from about 10 sccm to about 200 sccm and the nitrogen gas may be provided to the RF parallel plate reactor in an amount ranging from about 10 sccm to about 2000 sccm. The RF power may range from about 100 watts to about 1200 watts, among others. Additionally, any suitable pressure level, for example one ranging from about 20 mT to about 500 mT, may be used. Moreover, the deposition temperature may range from about room temperature to about 100° C.

In certain embodiments the same RF parallel plate reactor may be used to form both the first semiconductor layer 120 and amorphous nitrided silicon adhesion layer 130. In certain other embodiments both the first layer 120 and adhesion layer 130 may be formed without breaking vacuum in the RF parallel plate reactor. For instance, in the embodiment wherein the first layer 120 comprises silicon doped diamond like carbon, the first layer 120 may be formed within the RF parallel plate reactor using tetra methyl silane and methane gas. Thereafter, and without breaking vacuum, nitrogen may be substituted for the methane to form the adhesion layer 130 (e.g., using tetra methyl silane and nitrogen gas). Other embodiments may also exist wherein the same RF parallel plate reactor is used.

After forming the adhesion layer 130, the chamber of the RF parallel plate reactor may be pump/purged using an inert gas. In one embodiment, Argon or Helium is used to pump/purge the chamber. Nevertheless, other gasses, including other inert gases, could also be used to pump/purge the chamber.

Additionally, after forming the adhesion layer 130, a second semiconductor layer 140 may be formed over the first semiconductor layer 120. The second layer 140, at least in the embodiment of FIG. 1, comprises a metal or metal alloy. For instance, in one embodiment the second layer 140 comprises tantalum (Ta). Nevertheless, the second layer 140 might also comprise various other metals or metal alloys, including AlN, TaC, TaWHf, $Ta_2O_5$, Ti, TiW, TiB, $TiB_2$, TiZr, TiZrN, TiN, WSi, Pt, Pd, Rh, and Ru. Moreover, it should be reiterated that the second layer 140 need not comprise a metal or metal alloy, and thus could also comprise various different dielectric materials.

Those skilled in the art understand the process for forming the second layer 140. For instance, depending on the material that the second layer 140 comprises, various conventional or non-conventional processes might be used to form the second layer 140. In the above discussed embodiment wherein the second layer 140 comprises tantalum, the second layer 140 might be sputter deposited using a tantalum target.

Figure 3:
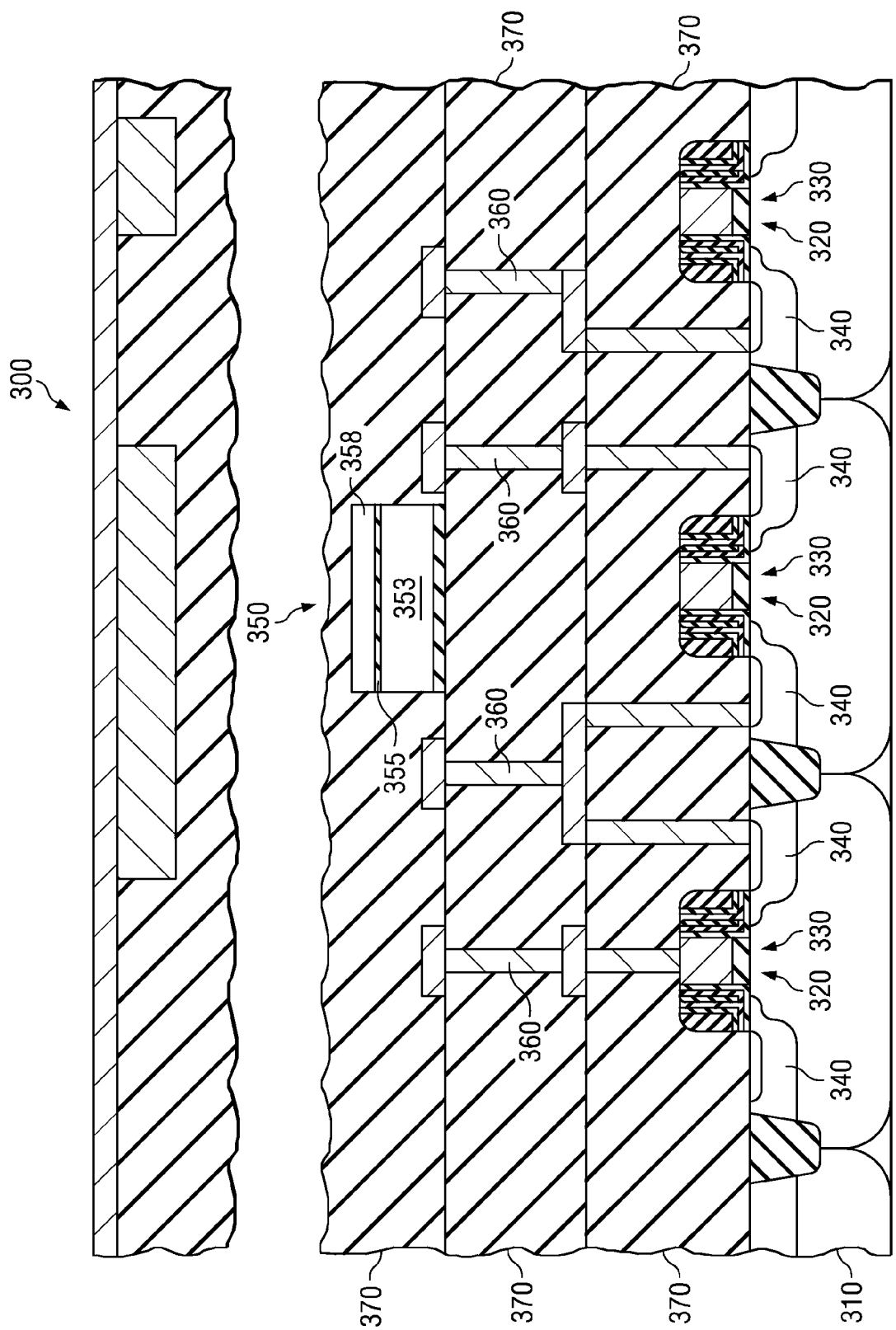
FIG. 3 illustrates an alternative embodiment of a semiconductor device.

FIG. 3 illustrates an alternative embodiment of a semiconductor device 300. The device 300 includes transistor devices 320 located over/in a substrate 310. The transistor devices 320 in this embodiment each include a gate structure 330 and source/drain regions 340. Also located over the substrate 310, and in this embodiment above the transistor devices 320, is a semiconductor feature 350. The feature 350 may include a first semiconductor layer 353, an amorphous nitrided silicon adhesion layer 355 and a second semiconductor layer 358. In one embodiment, the first semiconductor layer 353, amorphous nitrided silicon adhesion layer 355 and the second semiconductor layer 358 are similar to the first semiconductor layer 120, amorphous nitrided silicon adhesion layer 130 and the second semiconductor layer 140, respectively, of FIG. 1. While the feature 350 of FIG. 3 is configured as a capacitor, those skilled in the art understand that it may also be configured as a resistor, fuse, Schottky diode, etc. without departing from the scope of this disclosure. Located over the devices 320 and the feature 350 are interconnects 360 located within dielectric layers 370. As illustrated, the interconnects 360 may electrically contact one or more of the transistor devices 320.

FIGS. 4-8 illustrate an alternative embodiment of a method for manufacturing a semiconductor device, in this embodiment an ink jet printhead 400. The printhead 400 of FIG. 4 includes a substrate 410. The substrate 410 may comprise many different materials. In one embodiment, however, the substrate 410 comprises a silicon substrate or other similar base substrate material.

Located over the substrate 410 is an insulative layer 420. As will be more apparent below, the insulative layer 420 electrically insulates subsequently formed layers from the substrate 410. In one embodiment, the insulative layer 420 comprises silicon dioxide. Nevertheless, other insulative materials might be used for the insulative layer 420. The insulative layer 420 may have a variety of thicknesses; however, in one embodiment a thickness of the insulative layer 420 ranges from about 500 nm to about 1000 nm.

Located over the insulative layer 420 is a resistive layer 430. The resistive layer 430 may comprise many different types of resistive material. Nevertheless, in one embodiment the resistive layer 430 comprises TaAl. However, the resistive layer 430 may also comprise TaN, TaAl(O,N), TaAlSi, TaSiC, Ti(N,O), WSi(O,N), CrSiC, TaAlN and TaAl/Ta, among others. The resistive layer 430 may also have a variety of thicknesses, however, in one embodiment a thickness of the resistive layer 430 ranges from about 10 nm to about 200 nm.

Located over the resistive layer 430 is a conductive spacer layer 440. The spacer layer 440, in the illustrated embodiment, is a metal spacer layer. For instance, the spacer layer 440 might comprise AlCu, among others, and remain within the purview of the disclosure. The spacer layer 440 may additionally have a variety of thicknesses, however, in one embodiment a thickness of the spacer layer 440 ranges from about 200 nm to about 1500 nm.

Those skilled in the art understand the processes that might be used to form the layers 420, 430 and 440 on the substrate 410. For example, in one embodiment conventional microelectronic fabrication processes such as physical vapor deposition (PVD) (e.g., sputtering) or chemical vapor deposition (CVD) may be used to provide the various layers on the substrate 410. The present disclosure, however, should not be limited to any specific process for forming layers 420, 430 and 440.

Figure 4:
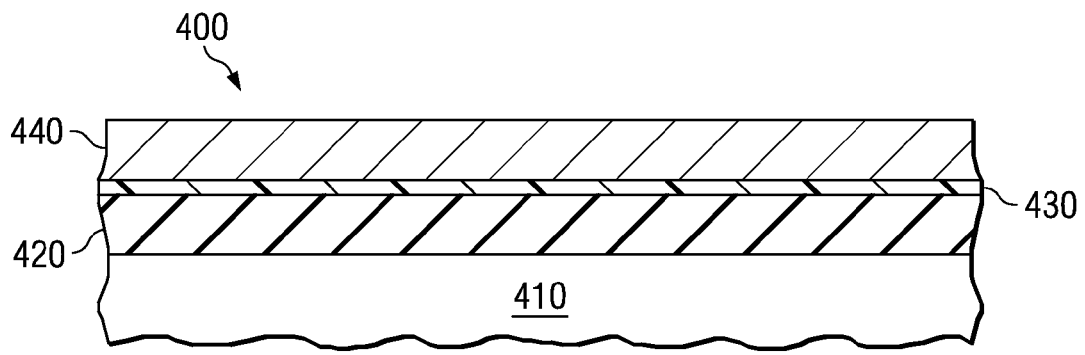
FIGS. 4-8 illustrate an alternative embodiment of a method for manufacturing a semiconductor device, for instance an ink jet printhead.
Figure 5:
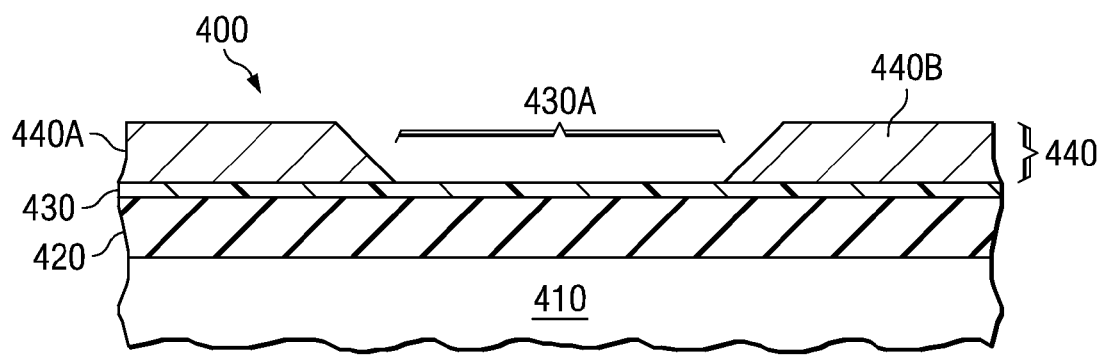

FIG. 5 illustrates the printhead 400 of FIG. 4 after etching the conductive spacer layer 440. In this embodiment, the conductive spacer layer 440 is etched to provide ground and power conductors 440A and 440B and to define the heater resistor 430A. The conductive spacer layer 440 may be etched using many different processes, conventional and not. Accordingly, the etching of the conductive spacer layer 440 should not be limited to any specific etching process or conditions.

Figure 6:
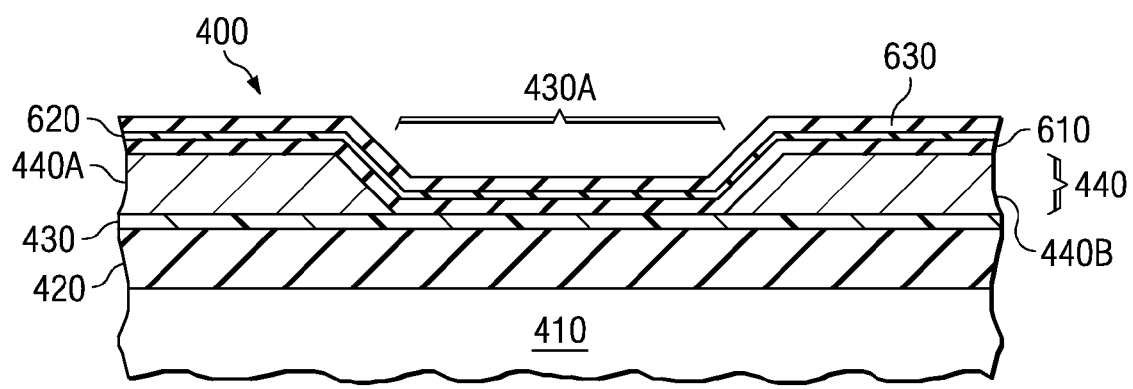

FIG. 6 illustrates the printhead 400 of FIG. 5 after forming a first semiconductor layer 610 over the substrate 410, an amorphous nitrided silicon adhesion layer 620 over the first semiconductor layer 610, and a second semiconductor layer 630 over the amorphous nitrided silicon adhesion layer 620. In the embodiment of FIG. 6, the first semiconductor layer 610 comprises a diamond like carbon layer (e.g., undoped, silicon doped, nitrogen doped, titanium doped, etc.) and the second semiconductor layer 630 comprises a cavitation layer. For clarity, the first semiconductor layer 610 will hereafter be referred to as the diamond like carbon layer 610 and the second semiconductor layer 630 will hereafter be referred to as the cavitation layer 630.

The layer of diamond like carbon 610, in the illustrated embodiment, is configured to protect the heater resistor 430A from corrosion and erosion, among other purposes. The layer of diamond like carbon 610, in contrast to many previous uses of the material, may have a thickness of greater than about 30 nm. For instance, the layer of diamond like carbon 610, in one embodiment, may have a thickness ranging from about 50 nm to about 800 nm, among others.

The layer of diamond like carbon 610, in one embodiment, comprises a titanium-doped diamond like carbon layer. In an alternative embodiment, the layer of diamond like carbon 610 comprises a single thin film diamond like carbon layer having at least a first surface comprised of more than about 30 atom % titanium. In other alternative embodiments, the layer of diamond like carbon 610 comprises multiple doped-diamond like carbon layers. For instance, the layer of diamond like carbon 610 might comprise a first substantially uniformly Si-doped diamond like carbon layer and a second Ti-doped diamond like carbon layer overlying the first Si-doped diamond like carbon layer.

In those embodiments wherein a Ti-doped diamond like carbon layer is used, the titanium may be uniformly doped, non-uniformly doped, or even have a low concentration of titanium adjacent one surface and a high concentration of titanium adjacent an opposing surface. For instance, the Ti-doped diamond like carbon layer may include from about 5 to about 15 atom % titanium substantially uniformly distributed there through. Alternatively, a first surface adjacent the heater resistor 430A may include a titanium concentration ranging from about 5 to about 15 atom % and the opposing surface may include a titanium concentration ranging from about 80 to about 95 atom %, or more. In such a case, interior portions between the opposing surfaces may have a titanium concentration of about 95 atom % or more. Alternatively, the Ti-doped diamond like carbon layer may have a step-wise increase in titanium from a first surface adjacent the heater resistor 430A to a second opposing surface.

Those skilled in the art understand the myriad of different processes that might be used to form the diamond like carbon layer 610. For example, in order to provide a Ti-doped diamond like carbon layer as described above, a plasma enhanced chemical vapor deposition (PE-CVD) reactor may be supplied with a precursor gas providing a source of carbon such as methane, ethane, or other simple hydrocarbon gas and from a vapor derived from an organometallic compound. Such compounds include, but are not limited to, bis(cyclopentadienyl)bis(dimethyl-amino)titanium, tert-Butyltris(dimethylamino)titanium, tetrakis(diethylamino)titanium, tetrakis(ethylmethylamino)titanium, tetrakis(isopropylmethylamino)titanium, and the like. A preferred organometallic compound is tetrakis(dimethylamino)titanium.

During the deposition process for the Ti-doped diamond like carbon layer, at least in this embodiment, the gasses in the reactor may be disassociated to provide reactive ions that are incorporated into a growing film. During film growth, a radio frequency (RF) bias may be applied to the substrate surface to promote retention of only strong diamond like carbon bonds. By adjusting the ratio of the feed gases, the ratios of the titanium to diamond like carbon in the growing film can be adjusted from about 0 atom % to about 100 atom %.

One specific embodiment for forming a titanium-doped diamond like carbon layer, is as follows: A titanium-doped diamond like carbon layer is formed on a substrate in a conventional plasma enhanced chemical vapor deposition (PECVD) chamber with about a 100 to about 1000 volt bias between the substrate and a gas plasma at an RF frequency of about 13.6 Khz. During deposition, the substrate is maintained at room temperature of about 25° C. Preferably, the gas plasma in the chambers includes vaporized methane and tetrakis(dimethylamino)titanium in helium gas (TDMAT/He). When a portion of the cavitation layer to be deposited is an undoped diamond-like carbon layer, the flow of TDMAT/He gas to the chamber is shut off thereby allowing a pure diamond like carbon layer to plate out or build up on the substrate. When a portion of the cavitation layer is to be essentially pure titanium, the methane gas to the chamber is shut off thereby allowing pure titanium to plate or build up or plate out on the substrate. Adjusting the ratio of TDMAT/He to methane in the plasma gas during the deposition process as described herein may make various ranges of titanium concentration in the diamond like carbon layer. The titanium-doped diamond like carbon layer is deposited at a pressure of about 10 mT to about 1 Torr using a substrate power of about 100 to about 1000 Watts with a methane flow rate ranging from about 10 to about 100 sccm and a TDMAT/He flow rate ranging from about 1 to about 500 sccm.

As mentioned above, the amorphous nitrided silicon adhesion layer 620 may be formed over the diamond like carbon layer 610. The amorphous nitrided silicon adhesion layer 620 may, in one embodiment, be formed having a similar thickness and using similar processes as the amorphous nitrided silicon adhesion layer 130 disclosed above. Accordingly, no further detail is needed.

As further indicated above, a cavitation layer 630 may be located over the layer of diamond like carbon 610. The term cavitation layer, as used throughout this disclosure, means a mechanical and/or electrical isolation layer between the resistive layer and the environment. The cavitation layer 630 may also comprise many different materials. For example, without limitation, the cavitation layer 630 may comprise tantalum, titanium or another similar metal. The cavitation layer 630 may also comprise many different thicknesses. Nevertheless, in one embodiment the cavitation layer 630 has a thickness ranging from about 100 nm to about 1000 nm, among others. Those skilled in the art understand the processes that might be used to form the cavitation layer 630, including sputter depositing the cavitation layer 630 in one embodiment. The amorphous nitrided silicon adhesion layer 620, as one would expect, helps adhere the cavitation layer 630 to the diamond like carbon layer 610.

Figure 7:
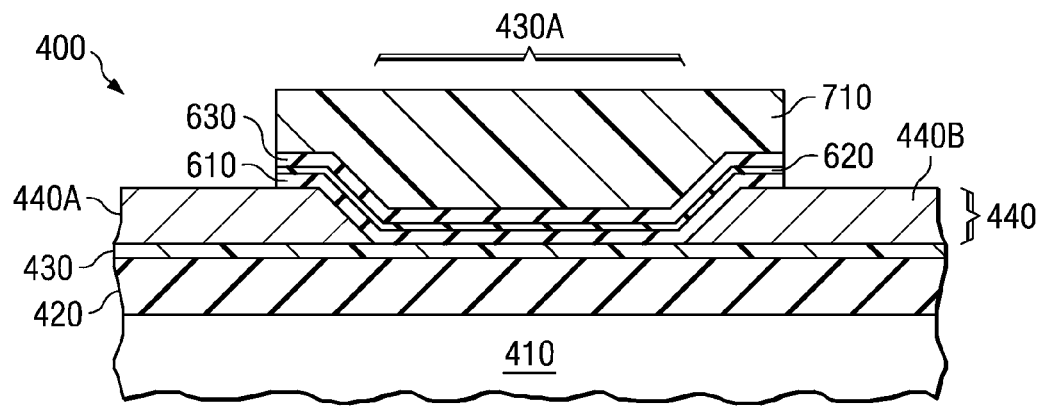

FIG. 7 illustrates the printhead 400 of FIG. 6 after patterning a layer of resist 710 over the substrate 410 and thereafter using the patterned layer of resist 710 to etch the diamond like carbon layer 610, amorphous nitrided silicon adhesion layer 620 and cavitation layer 630. The process for patterning the layer of resist 710, in one embodiment, may be a conventional process. For instance, the process for patterning the resist 710 may include the application of a layer of resist material to a substrate (e.g., the cavitation layer 630 in this embodiment), followed by the selective exposure of the resist layer to an energy source, wherein portions of the resist layer are changed in character due to their exposure to the energy source. After such exposure, the resist layer is then developed by a "wet development process" (e.g., employing liquid chemical solvents to selectively remove portions of the resist) to provide the desired pattern therein.

The diamond like carbon layer 610, amorphous nitrided silicon adhesion layer 620 and cavitation layer 630 may be etched using many different techniques and/or etchants. In one embodiment, however, the diamond like carbon layer 610, amorphous nitrided silicon adhesion layer 620 and cavitation layer 630 are etched using a wet or dry reactive ion etch (e.g., plasma) process. Furthermore, those skilled in the art understand the etch parameters that might be used.

Figure 8:
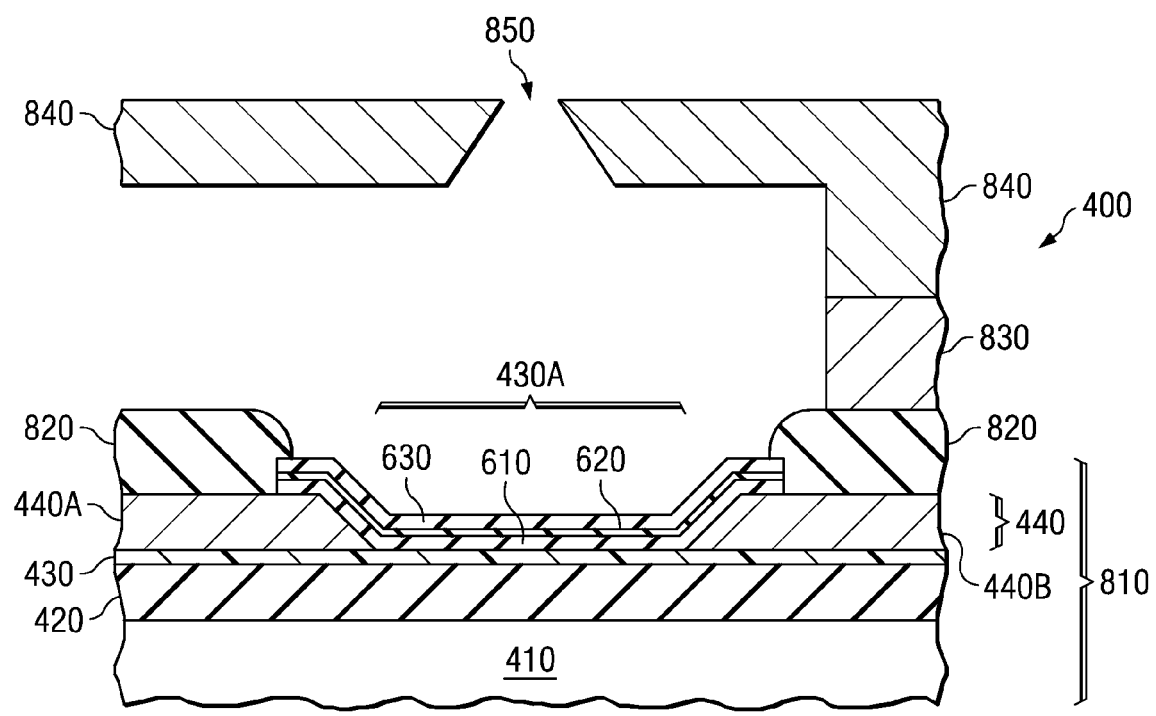

FIG. 8 illustrates the printhead 400 of FIG. 7 after forming an insulative layer 820 on exposed portions of the spacer layer 440, and in this embodiment over a heater chip 810 portion of the printhead 400. The insulative layer 820 may again comprise silicon dioxide or another similar material, and may additionally overlap the patterned diamond like carbon layer 610, amorphous nitrided silicon adhesion layer 620 and cavitation layer 630. Any suitable manufacturing process might be used to deposit and pattern the insulative layer 820.

FIG. 8 further illustrates that another conductive layer 830 may be formed in contact with the insulative layer 820. The conductive layer 830, in one embodiment, is in contact with the spacer layer 440. The conductive layer 830 may comprise any suitable conductive material (e.g., AlCu) and thickness. Additionally, the conductive layer 830 may be formed using any suitable manufacturing process.

FIG. 8 additionally illustrates that a nozzle plate 840 having one or more openings 850 therein may be attached to the heater chip 810. The nozzle plate 840 may be attached to the conductive layer 830 using, among others, an adhesive. Those skilled in the art understand the process of attaching the nozzle plate 840 to the heater chip 810.

Those skilled in the art to which the disclosure relates will appreciate that other and further additions, deletions, substitutions and modifications may be made to the described embodiments without departing from the scope herein.

What is claimed is:

1. A method for manufacturing a semiconductor device, comprising:
    forming transistor devices over a substrate, wherein each of the transistor devices includes a gate structure and source/drain regions;
    forming a semiconductor feature over the substrate, including:
        forming a first semiconductor layer over the substrate, wherein the first semiconductor layer comprises diamond like carbon; and
        forming a second semiconductor layer over the first semiconductor layer, wherein an amorphous nitrided silicon adhesion layer is located between, entirely separates, and adheres the first and second semiconductor layers; and
    forming interconnects within dielectric layers located over the transistor devices and semiconductor feature, wherein one or more of the interconnects electrically contact one or more of the transistor devices.

2. The method of claim 1 wherein forming a first semiconductor layer includes forming a diamond like carbon layer using tetra methyl silane and methane gas.

3. The method of claim 2 wherein the amorphous nitrided silicon adhesion layer is formed using tetra methyl silane and nitrogen gas.

4. The method of claim 2 wherein the diamond like carbon layer and the amorphous nitrided silicon adhesion layer are formed in a same reactive ion etch chamber.

5. The method of claim 4 wherein the diamond like carbon layer and the amorphous nitrided silicon adhesion layer are formed in the same reactive ion etch chamber without breaking vacuum.

6. The method of claim 1 wherein the semiconductor feature forms at least a portion of a resistor, a fuse, a capacitor or a Schottky diode.

* * * * *